United States Patent [19]

Blossfeld

[11] Patent Number: 4,778,774

[45] Date of Patent: Oct. 18, 1988

[54] PROCESS FOR MANUFACTURING A MONOLITHIC INTEGRATED CIRCUIT COMPRISING AT LEAST ONE BIPOLAR PLANAR TRANSISTOR

[75] Inventor: Lothar Blossfeld, Freiburg, Fed. Rep. of Germany

[73] Assignee: Deutsche ITT Industries GmbH, Freiburg, Fed. Rep. of Germany

[21] Appl. No.: 28,472

[22] Filed: Mar. 20, 1987

[30] Foreign Application Priority Data

Mar. 22, 1986 [EP] European Pat. Off. ........ 86103946.9

[51] Int. Cl.⁴ .................... H01L 21/265; H01L 21/70
[52] U.S. Cl. ......................................... 437/31; 437/32; 437/59; 437/162; 437/34; 357/43; 357/59; 357/34; 357/35; 148/DIG. 9; 148/DIG. 11
[58] Field of Search .................. 437/31, 32, 33, 34, 437/162, 59; 148/DIG. 9, DIG. 11; 357/59 H, 34, 35, 43; 156/643

[56] References Cited

U.S. PATENT DOCUMENTS

| | | | |
|---|---|---|---|
| 4,445,268 | 5/1984 | Hirao | 437/31 |
| 4,477,965 | 10/1984 | Blossfeld | 437/31 |
| 4,483,738 | 11/1984 | Blossfeld | 437/31 |
| 4,495,010 | 1/1985 | Kranzer | 357/59 H |
| 4,503,603 | 3/1985 | Blossfeld | 437/31 |
| 4,531,282 | 7/1985 | Sakai et al. | 437/31 |
| 4,546,536 | 10/1985 | Anantha et al. | 437/32 |
| 4,550,490 | 11/1985 | Blossfeld | 437/31 |
| 4,583,106 | 4/1986 | Anantha et al. | 357/59 H |
| 4,640,721 | 2/1987 | Uehara et al. | 437/31 |
| 4,662,057 | 5/1987 | Yasuoka et al. | 437/31 |
| 4,691,436 | 9/1987 | Hirao | 357/34 |
| 4,694,562 | 9/1987 | Iwasaki et al. | 437/33 |

FOREIGN PATENT DOCUMENTS

| | | | |
|---|---|---|---|
| 1203641 | 4/1986 | Canada . | |
| 0071665 | 2/1983 | European Pat. Off. | 21/265 |
| 0101000 | 2/1984 | European Pat. Off. | 27/6 |
| 0139266 | 5/1985 | European Pat. Off. | 27/6 |
| 3129539 | 7/1981 | Fed. Rep. of Germany . | |
| 2531812 | 2/1984 | France | 27/6 |
| 2081507 | 2/1982 | United Kingdom . | |

Primary Examiner—Brian E. Hearn
Assistant Examiner—Mary Wilczewski
Attorney, Agent, or Firm—T. L. Peterson

[57] ABSTRACT

The invention includes a method of manufacture of monolithic integrated VLSI circuits comprising bipolar transistors whose base regions are contacted in a self-aligned manner in proximity to the respective emitter regions by the use of silicide layers. The invention starts out from a process which, when using an insulating masking layer portion covering up the emitter area of the planar transistor, permits the self-aligned fabrication of emitter regions extending to the adjoining base region and to the base contacting region. Further embodiments of the process according to the invention permit the simultaneous manufacture of co-integrated CMOS circuits and of polycrystalline. Si-conductor leads whose resistances are reduced owing to the use of silicide layers.

8 Claims, 4 Drawing Sheets

PROCESS FOR MANUFACTURING A MONOLITHIC INTEGRATED CIRCUIT COMPRISING AT LEAST ONE BIPOLAR PLANAR TRANSISTOR

BACKGROUND OF THE INVENTION

The invention deals with a process suitable for manufacturing monolithic integrated highest-frequency circuits which each contain at least one integrated bipolar planar transistor, and also still other integrated components, such as insulated-gate field-effect transistors, integrated capacitors or integrated resistors. The process to be disclosed by this invention as well as the discussion of the state of the art, in order to facilitate the understanding and to simplify the description, however, is referred to as a process for manufacturing a monolithic integrated circuit of the type comprising at least one bipolar planar transistor. Thus, no restriction is to be seen in this, especially since it has long since been known to manufacture a number of monolithic integrated circuits on a larger semiconductor wafer from which the individual circuits are cut and which are only thereafter encapsulated individually.

A process of this kind has already been disclosed previously in the German Offenlegungsschrift DE-A 32 43 059 or DE-A 31 29 5239. In that process used doped polycrystalline silicon layers are used in order in a self-aligning manner to fabricate the base-contacting region with its base electrode and to fabricate the emmiter region with its emitter electrode in a direct or close proximity in relation to each other. In that way it is possible to achieve a very low base lead-in resistance and a relatively high operating speed. Moreover, such a self-aligning process basically offers the advantage that safety distances in the photolithographic processes can be reduced to a minimum, so that the side dimensions of the bipolar planar transistors can likewise be reduced. The disadvantage of the process as disclosed in the aforementioned German Offenlegungsschrift DE-A 31 29 539 is that an expensive epitaxial process is used which, according to experience, only permits a small yield. One disadvantage of the process disclosed in the German Offenlegungsschrift DE-A 32 43 059 as likewise referred to hereinafter, resides in that the overlapping capacity between both the emitter electrode and the base electrode which capacitance restricts the operating speed.

The invention, therefore, starts out from the process as disclosed in the European Patent Application EP-A-71 665 which has substantially overcome the aforementioned disadvantages, by taking up the idea as disclosed in DE-OS (German Offenlegungsschrift) 31 29 539, of providing the lead (series) resistance of the polycrystalline silicon electrodes, which transition into conducting conductor leads, with superficial layers of silicide in order thus to reduce the lead-in resistance. At the same time, this causes an increase of the operating speed of the monolithic integrated circuit.

While the aforementioned German Offenlegungsschriften (DE-OS's) do not deal with the manufacture or fabrication of the collector electrode, it is the case with one type of embodiment of the process as disclosed in the European Patent Application EP-A-71 665, that the collector contacting region is made in a self-aligned manner with regard to both the emitter region and the base contacting region which manner, however, does not apply to the fabrication of the contacts to the regions to be contacted.

In the conventional process as disclosed in the aforementioned European Patent Application EP-A-71 665, for manufacturing a monolithic integrated circuit having at least one bipolar planar transistor, the collector region lies on one main surface of a semiconductor substrate, and is formed on this surface within the opening or window of a layer of field oxide, to wit, a collector area. For manufacturing both the emitter region and the base region in a self-aligned manner in relation to one another, the emitter area is covered with an oxidation masking layer portion of a first oxidation making layer of thickness such that the latter, in the course of an ion implantation process of high energy, is penetrated by dopants of the base region and, in the course of another ion implanation process of low energy, marks the dopants from the base region. Following the implanation processes, which are carried out by using an implanation mask defining the base area, the exposed semiconductor surface is thermally oxidized by forming an oxide frame surrounding the emitter area, whereupon the first oxidation masking layer portion is removed. Finally, the main surface is covered with a layer of foreign oxide in which is defined contact openings (windows) over the regions which are contacted through the openings by electrodes. The contacting of the regions, as is customary with planar integrated circuits, is effected by way of conductor leads extending on thermally produced oxide and/or on a layer of foreign oxide and which, through contact openings (windows) defined in these insulating layers, serve to contact the regions, or else is effected by the electrodes as are already attached to the regions.

SUMMARY OF THE INVENTION

The fabrication of the contacting openings (windows) in the insulating layers call for special photolithographic etching process safeguarding a certain lateral safety distance in relation to the regions to be contacted, in order thus to avoid the short-circuiting of a pn-junction on the semi-conductor surface. The object underlying the present invention is to provide a process starting with the process as disclosed in the aforementioned EP-A-71 665 which permits the self-aligned manufacture of all regions of the planar transistor in relation to the regions contacting them.

The solution to the problem solves the "frame" problem and increasing the operational speed. As part of solving this "frame" problem, the process according to the invention forms a low-ohmic contact for the base region which is in the direct (or close) proximity to the emmiter region without having to observe a safety distance.

Furthermore, the process according to the invention offers the further advantage in that it is compatible with the co-integration of insulated-gate field-effect transistors as fabricated by the process disclosed in the aforementioned EP-A-71 665.

With the aid of the steps and measures of the process according to the invention a further increase in operating speed in monolithic integrated circuits is achievable.

BRIEF DESCRIPTION OF THE DRAWINGS

The process according to the invention as well as advantage of further embodiments will now be described in greater detail with reference to FIGS. 1 to 8 of the accompanying drawings, in which.

DETAILED DESCRIPTION

FIGS. 1-6 of the accompanying drawings refer to one example of embodiment of the process according to the invention by which monolithic integrated circuits are manufactured which not only contain bipolar planar transistors, but also insulated-gate field-effect transistors which can be fabricated simultaneously in the same semiconductor wafer. A manufacturing process which permits the fabrication of bipolar planar transistors on a semiconductor wafer simultaneously with integrated CMOS circuits has generally been the subject matter of various publications and in particular is one of the further embodiments of the invention as claimed below.

Figure 1:
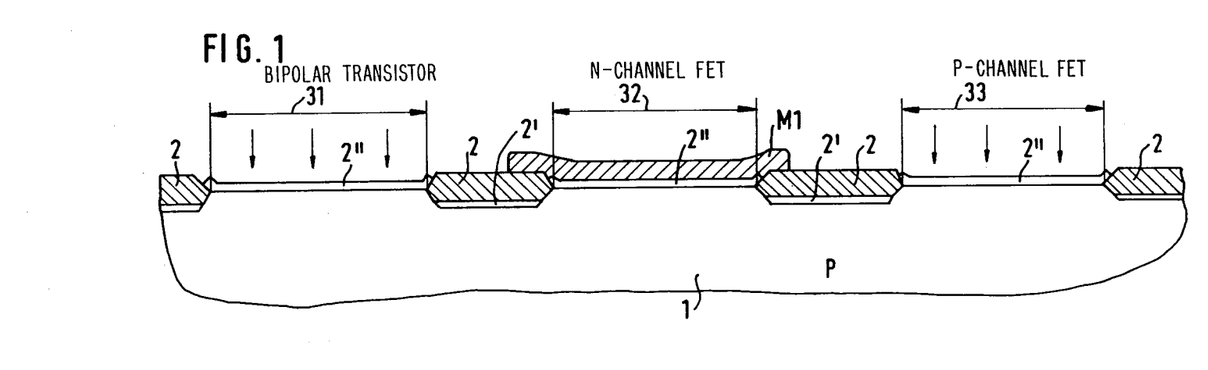
FIGS. 1 to 6 serve to explain the successively following processing steps of the process according to the invention, FIG. 7, in a sectional view, shows the bipolar planar transistor in the stage as illustrated in FIG. 6 and as seen through lines A—A of FIG. 8.
Figure 2:
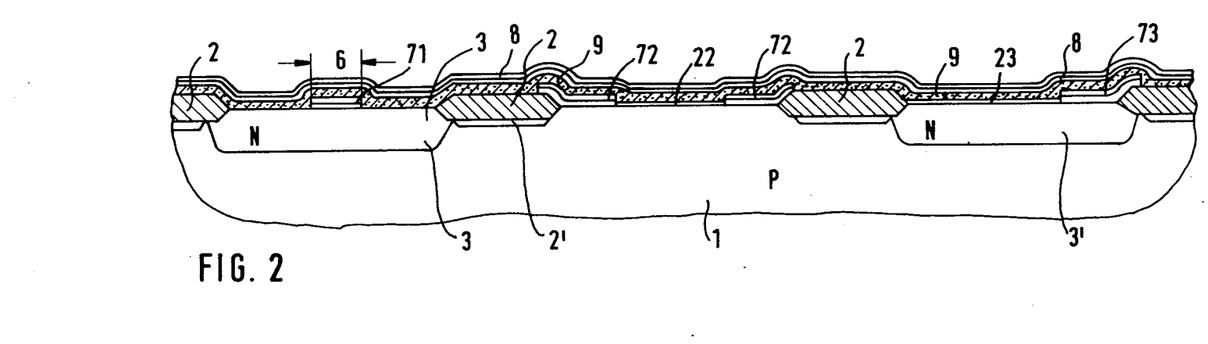

The example of embodiment explained with reference to FIGS. 1 to 6 of the accompanying drawings, therefore, refers to such a further embodiment which, at the same time, permits fabrication of a bipolar planar transistor and a complementary pair of Si-gate field-effect transistors. The drawings schematically show a section of such a monolithic integrated solid-state circuit in the usual oblique view, with the bipolar planar transistor being fabricated in the opening (window) 31 provided for in the layer of field oxide 2, with an N-channel field-effect transistor being fabricated within the area 32, and with a P-channel field-effect transistor being fabricated within the opening (window) 33 of the layer of field oxide 2. This layer of field oxide 2 can be produced in the known manner by using an oxidation masking layer, with channel-interrupting layers 2' of the same conductivity type as that of the substrate 1 being provided for below the layer of field oxide 2, as shown in FIG. 2. In the course of manufacturing the substrate, regions 3 and 3' in the p-conducting substrate 1, and the area 32 is covered with the aid of the implantation mask M1 shown in FIG. 1, so that in the course of the following implanation of n-doped impurities, only the substrate surfaces within the areas 31 and 33 are doped. In the course of a following diffusion process carried out after the implantation mask M1 has been removed, there are obtained the substrate regions 3 and 3' as shown in FIG. 2. Upon removal of the oxidation masking layer 2'', a first oxidation masking layer portion 71 is fabricated which covers the emitter area 6. For this purpose the entire main surface of the chip is covered with an Si-nitride layer or else with a sequence of layers comprising a double layer of a silicon nitride and a silicon oxide and from which, by the employment of a photolithographic etching process using conventional etching agents (or etchants), oxidation masking layer portion 71 is defined.

After that, in the process according to the invention, the main surface of the semiconductor substrate is covered with the first polycrystalline silicon layer 9 as shown in FIG. 2, on which there is then deposited the second oxidation masking layer 8 which may likewise be comprised of a lower silicon oxide layer which promotes adherence, and of an upper layer of silicon nitride.

In the case of a co-integration of insulated-gate field-effect transistors, and in the course of fabricating the first oxidation masking layer portion 71, which covers the emitter area 6, a masking layer portion 72 or 73 is produced which overlaps field oxide layer 2, and which defines an exposed area of the semiconductor substrate in the openings (windows) 32 or 33 laying respectively at the rim portion or edge of the openings. In the case of manufacturing insulated-gate field-effect transistors it is possible, in accordance with the known state of the art, and prior to the fabrication of the gate oxide layers 22 or 23, which may correspond to the lower partial layer of the oxidation masking layer, to dope by way of ion implanation the substrate surface laying therebeneath in accordance with the desired field threshold voltages.

Figure 7:
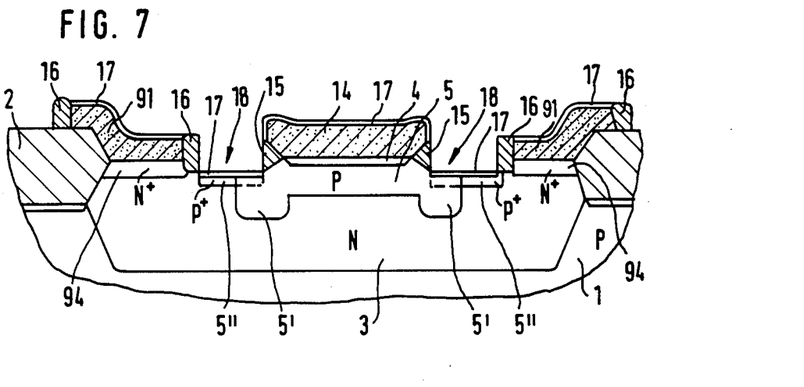
Figure 8:
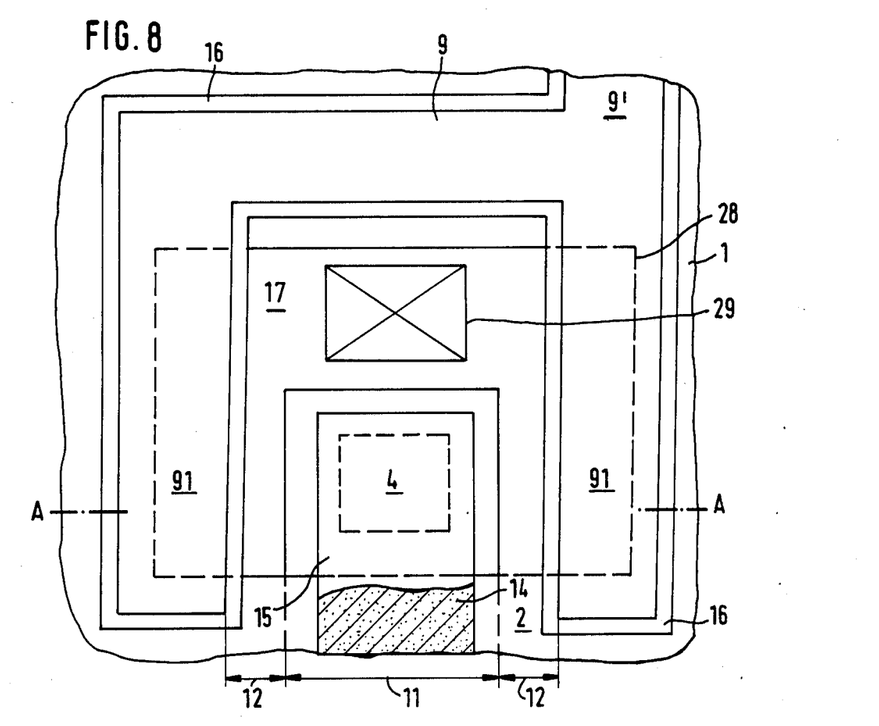
FIG. 8 is the top view corresponding to the sectional view as shown in FIG. 7.

In the main surface of the chip, with the aid of an etch mask consisting, e.g., of a photoresist, collector electrode 91 is formed from the layer sequence comprised of the second oxidation masking layer 8 and of the polycrystalline silicon layer 9. Collector electrode 91 is superficially covered by the oxidation masking layer portion 81. That particular area of the semiconductor surface which includes the base area 11 and a marginal area 12 at least partially surrounding the latter is then exposed or etched out. This area, as will be easily understood from the following description, corresponds to the contact area of the base electrode. When a contact to the emitter region 4 is formed - cf. FIGS. 6, 7 and 8 - with the aid of a conductor lead of the type as shown in FIG. 8, the collector electrode 91 preferably remains open on a side, in order thus to achieve a low overlapping capacitance.

In the process according to the invention, it is also possible for the oxidation masking layer 71 to touch the rim portion 27 of the field oxide layer 2. This then results in a planar transistor structure in which the base electrode as well as also the base contacting region only partially surround the emitter region 4 as shown in FIG. 8. In this particular case only that part of layer 71 which does not border on the field oxide layer 2 is removed to expose the semiconductor surface.

Figure 3:
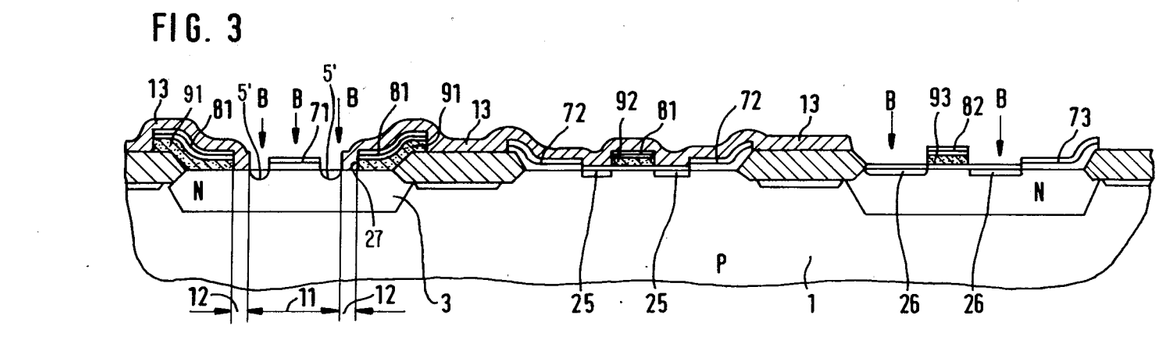

Now, onto the main surface of the substrate 1 an implanation mask 13, for example, of photoresist, is deposited into which is defined an opening corresponding to the base area 11, as is illustrated in FIG. 3. Moreover, according to the depiction of FIG. 3 when manufacturing N-channel field-effect transistors with the aid of the implanation mask 13, the opening (window) 32 within the field oxide 2 which corresponds to the substrate contacting surface, is covered up. If, at the same time, a P-channel field-effect transistor is fabricated in the opening (window) 33 of the field oxide 2, its substrate containing area was covered up by the oxidation masking layer portion 73 in the course of fabricating the first oxidation masking layer portion 71 which covered up the emitter area 6 of the bipolar device. The implanting dopants of the conductivity type of the base region 5 of the planar transistor, can then be utilized for fabricating the regions 26 (source and drain region) of the P-channel field-effect transistor. The gate electrode 93 consisting of polycrystalline silicon, and which is covered up by the oxidation masking layer portion 82, is fabricated together with the collector electrode 91 as covered up by the oxidation masking layer 81. Gate electrode 93 is utilized for the self-aligned manufacture of the regions 26 which serve to restrict the channel area.

After that, and in any arbitrary order of succession, there are carried out two ion implantation processes of dopings of the conductivity type of the base region, with the one of these implanation process being performed at a relatively high energy penetrating the oxidation masking layer portion 71, and with the other of these implanatation processes being performed at a relatively low energy, so that the oxidation masking layer portion 71 will have a masking effect. On this occasion the dopants of the regions 26 of the P-channel transistor are implanted into the substrate surface.

Following a masking of the openings (window) 31 and 33, not shown in FIG. 3, it is possible with the help of a special implanation mask of photoresist, to implant the dopings of the regions 25 of the N-channel field-effect transistor into the substrate surface, with the oxidation masking layer portion 72 within the opening (window) 32, as covering up and masking the region contact areas of the N-channel field-effect transistor, as well as the gate electrode 92 which is covered up and masked by the oxidation masking layer portion 81.

After that a thermal oxidation is carried out, with the effect thereof being illustrated with reference to FIG. 4. In the course of this the implanted doping material, by being activated, diffuses into the substrate 1. Moreover, the silicon which is either completely exposed or not covered up by parts of the gate oxide layer portions 22 and 23, is oxidized, in the course of which, within the opening (window) 31 of the bipolar planar transistor, there is formed an oxide frame 21 surrounding the first oxidation masking layer portion 71, and the rim portion of the collector electrode 91 is oxidized. In the course of this and owing to the volume expansion during oxidation, oxide layer portions in the form of a bird's beak 21' are created. In those cases (e.g., FIG. 8) where the oxidation masking layer portion 71 touches field oxide 2, the oxide frame 21 will only partially surround the emitter area, viz. merely at those points where the oxidation masking layer portion 71 is not in contact with the field oxide 2.

During this oxidation and in further embodying the process according to the invention, the exposed rim portions of the gate electrodes 92 and 93 are thermally oxidized in the same way, with the layers of oxide on the regions 25 and 26 becoming thicker.

Figure 5:
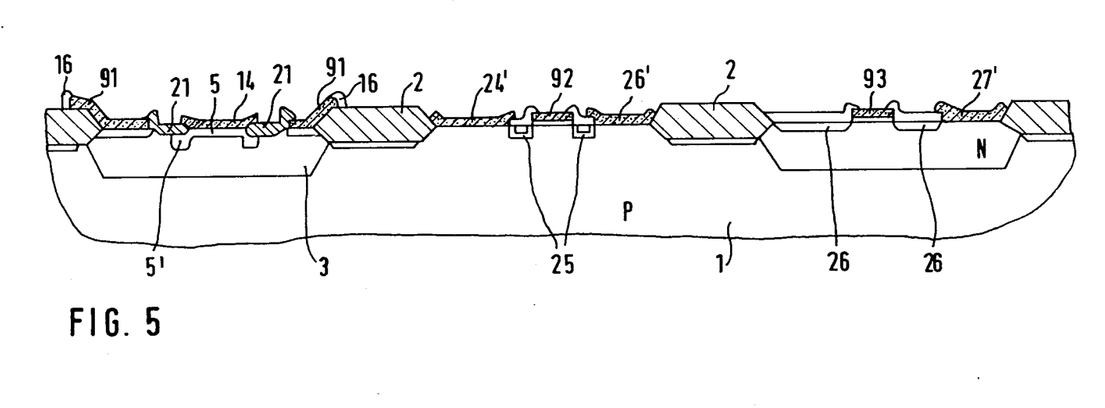

Next, all oxidation marking layer portions, or in the case of there being no field-effect transistors, at least that on the portions 71 and 81 of the bipolar planar transistor, as can be seen from FIG. 5, are removed.

Figure 6:
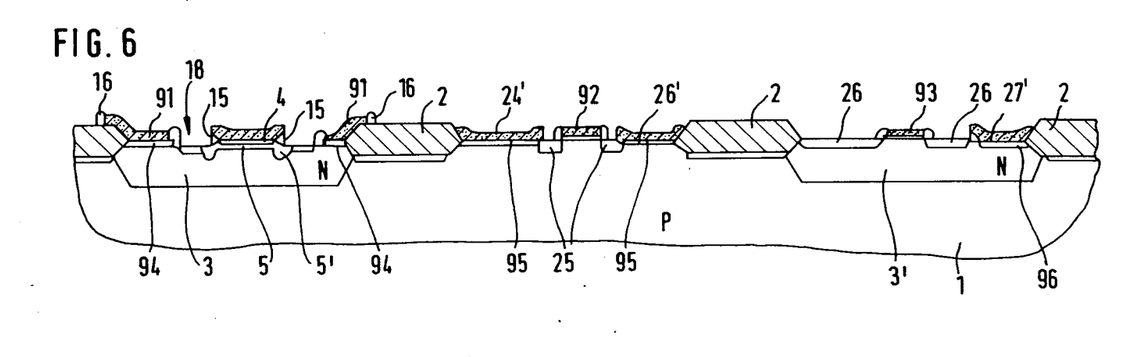

Then, in the case of a diffusion of the emitter region from the doped emitter electrode before, or in the case of doping the emitter region by way of a special implantation process, after the introduction of the dopants, the emitter electrode 14 of a doped polycrystalline silicon in FIG. 5 is deposited which, in the latter case, of course, must contain dopant of the same conductivity type as that of the emitter region 4 in FIG. 6.

In order to obtain a minimum base resistance, steps and measures have to be taken for attaching the base electrode as near as possible to the emitter electrode on the substrate surface, and with the smallest distance or spacing.

The process according to the invention makes use of the idea of reducing this distance or spacing, by way of dimensioning the thickness of the oxide frame 21, to such an extent that a short-circuit between the emitter electrode and the base electrode is just avoided (or excluded). The thickness of the oxide frame 21, anyhow, can be very exactly controlled by way of a controlled thermal oxidation. If now the optimal small thickness of this oxide frame, which is decisive of the spacing between the electrodes, is set to be optimally small, extremely exact positioning of the emitter electrode overlapping the inner rim portion of the oxide frame 21 is no longer required. Accordingly, the photolithographic etching process for etching the emitter electrode 14 out of an overlying layer of polycrystalline silicon, requires no very high accuracy, hence, no practically small safety distance. When the oxidation masking layer portion 81 touches or is in contact with a rim portion of the field oxide 2, then the emitter electrode 14, overlaps in part the inner rim portion of the oxide frame 21 and a rim portion of the emitter area 4 borders on the rim portion of the field oxide 2. Anyhow, care will have to be taken that the entire rim portion of the emitter electrode 14 is disposed at a sufficiently large spacing or distance from the substrate surface lying vertically therebeneath.

Figure 4:
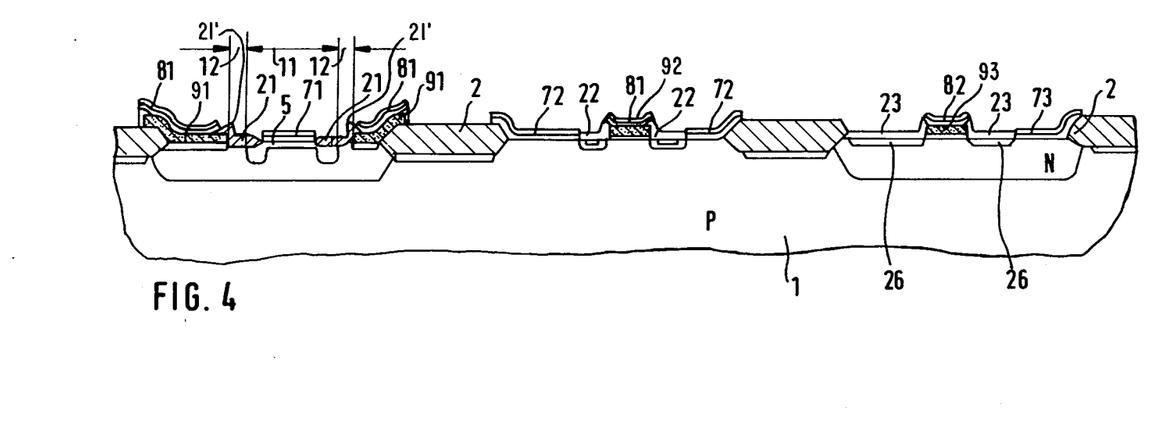

In the preferred embodiment of the process according to the invention for manufacturing at least one insulated-gate field-effect transistor in the openings (windows) 32 or 33 in the substrate surface exposed after removal of the oxide masking layer portions 72 or 73 in FIG. 4, and within at least one of the further openings (windows) 32 or 33, the electrode 24' or 26', respectively, are attached to the parts of the substrate surface lying therebeneath. Considering that these electrodes are fabricated in the same way as and simultaneously with the emitter electrode 14 from a uniformly doped layer of polycrystalline silicon, these electrodes serve or act as diffusion source for n-doping impurities. Hence, in a process performed at sufficient temperatures, the contacting regions 95 for the regions 25 of the N-channel field-effect transistor, as well as a contacting region 96 for the substrate region 3' of the P-channel field-effect transistor are formed, as can be readily seen from FIG. 6.

Prior to this thermal treatment, however, and by using an etch mask, preferably of photoresist, an anisotropic etching is carried out from the gas phase, in the course of which the overlapping part of the emitter electrode 14 is used as the etch mask, and the oxide frame 21 is removed, down to the semiconductor surface thereby exposing substrate area 18 in FIG. 6. In this way there is created below the edge or rim portion of the emitter electrode 14 a strip of oxide 15 at least partly enclosing it, as is shown in FIG. 6. Since the rim portion of the collector electrode 91 has likewise been oxidized in the course of the oxidation for fabricating the oxide frame 21, the rim portion of the collector electrode 91 is likewise enclosed with the exception of the part 9' in FIG. 8 where the collector electrode 91 connects to the printed conductor pattern. This is illustrated in FIGS. 7 and 8 of the drawings. FIG. 7 represents a sectional enlargement of the bipolar planar transistor shown in FIG. 6, and FIG. 8 is a top view onto the sectional view of FIG. 7 showing a section taken on line A—A of FIG. 8. In this FIG. 8 the partly dashed line 28 indicates the rim portion of the opening (window) 31, i.e., the boundary of field oxide layer 2.

In order to reliably prevent the PN junction between the base contacting region 5' and the collector region 3 from becoming superficially shorted (or short-circuited) by the base electrode, ions of the conductivity type of the base region 5 are thereafter implanted into the exposed substrate area 18. Hence, a contacting region portion 5" is formed in the course of a later or subsequent diffusion, as can be clearly recognized from FIG. 7. During this diffusion, dopings of the conductivity type of the collector region diffuse out of the collector electrode 91 by forming the collector contacting region 94.

In the course of the process of implanting impurities of the conductivity type of the base region, for example, boron in the case of an integrated NPN planar transistor, at least the area of the N-channel field-effect transistor should be protected with the aid of photoresist mask in cases where the possible formation of a disturbing PN junction on the surface of the n-doped regions 25 is feared.

There is then effected the deposition of a metal layer consisting of a metal forming a silicide, onto the main surface of the chip in a thickness less than the thickness of the strip of oxide 15, in order to avoid or exclude any short-circuiting between the emitter electrode 14 and the base electrode. Thereafter the chip is heated to such an extent that a layer of silicide 17 is formed on the emitter electrode 14, on the collector electrode 91, and on the exposed substrate area 18.

In cases where in the course of the step of manufacturing the collector electrode and/or in the course of the step of manufacturing the emitter electrode of a doped polycrystalline silicon, conductor patterns are etched out of the polycrystalline silicon layers, which contain the collector electrode 91 or the emitter electrode 14 respectively, these conductor patterns of course are likewise covered by the aforementioned metal layer. The same applies in cases where, in accordance with a further embodiment of the process of the invention, conductor patterns are fabricated which include either the gate electrodes 92 and 93 or else also the collector contacting electrode 27' of the P-channel field-effect transistor.

After this chip is heated to such an extent that a layer of silicide 17 is formed at least on the emitter electrode 14, on the collector electrode 91, and on the exposed substrate area 18. Accordingly, in cases were platinum is used which, as is well known, dissolves in aqua regia (nitrohydrochloric acid), the aforementioned heating step causes the formation of a layer of platinum silicide which is largely not attacked by aqua regia. Hence, if in accordance with the process of the invention, the arrangement is dipped into aqua regia, the platinum which has not been used up by the formation of a silicide is removed, but will remain on the electrodes. In the case of a further embodiment of the process according to the invention dealing with the fabrication of conductor patterns, layers of platinum silicide on the conductor leads and on the electrodes which show considerably lower lead-in resistance than would be possible to achieve with merely doped polycrystalline layers.

As can be recognized from FIG. 8, the active region portions of the bipolar planar transistor are within the rim portion 28 of the opening (window) 31 (FIG. 1) of the layer of field oxide 2. The latter is overlapped at least within the area of the section A—A by collector contact electrode 91. The collector contact electrode 91 surrounds the base area 11 in a U-shape and a collector region area 12 borders thereon, up to the rim portion of the collector electrode part 91. The collector electrode itself, by way of the collector electrode part 9', is enclosed by a strip of oxide 16 (see FIG. 5). The collector electrode 91 partially surrounds the emitter electrode 14 in order to leave room for the conductor pattern to which the emitter electrode 14 connects. The area of the emitter region 4 is enclosed by the strip of oxide 15 which, on the side where the emitter electrode 14 connects to the conductor pattern, extends up to the field oxide 2. There in fact, the anisotropic etching is masked with the exception of the substrate. The base electrode 17 consisting of a silicide, for instance, of the aforementioned platinum silicide, would short-circuit the PN junction between the base region 5 or the base contacting region 5' if no contacting region portion or part 5" were arranged below the base electrode 17, as is shown in FIG. 7. Contact to the base electrode 17 is effected through the contact opening 29 in FIG. 8 as defined within a foreign-oxide layer which is deposited onto the entire chip and by a metallic conductor pattern applied to the layer of foreign oxide.

Accordingly, a further embodiment of the process, disclosed by the invention, for manufacturing highly integrated circuits employing silicized conductors (conductor leads) and CMOS circuits, is the advantage that it is not only possible to benefit from the advantages of very high-speed bipolar planar transistors, but also a low power consumption in the case of CMOS circuits in peripheral logic circuits.

What is claimed is:

1. An improvement in a method for manufacturing a monolithic integrated circuit in a semiconductor substrate characterized by a main surface, said circuit comprising at least one bipolar planar transistor, a field oxide layer being disposed upon said main surface of said semiconductor substrate and a first opening defined therein selectively exposing part of said main surface of said semiconductor surface substrate, said bipolar planar transistor having a collector region defined in said semiconductor substrate within said first opening, and an emitter region and base region being defined within said collector region, said emitter region being covered with a first oxidation masking layer of predetermined thickness so that in the course of an ion implantation step of high energy said first oxidation masking layer is penetrated by dopants of the type of conductivity of said base region, and in the course of a second ion implantation step of low energy, said first oxidation masking layer is a barrier for said emitter area for dopants of the type of conductivity of said base region, said base region being defined by ion implantation utilizing an implantation mask, an oxide frame being formed by thermal oxidation at least partially surrounding said emitter region after removal of said first oxidation masking layer, said improvement comprising the steps of:

subsequent to disposition of said first oxidation masking layer on said emitter region, covering said main surface of said semiconductor substrate with a first polycrystalline silicon layer;

disposing a second oxidation masking layer on said first polycrystalline silicon layer;

selectively removing portions of said first polycrystalline silicon layer and said second oxidation masking layer to form a collector electrode covered with the remaining portion of said second oxidation masking layer, said removed portion of said polycrystalline silicon layer and second oxidation masking layer exposing that portion of said main surface of said semiconductor surface including at least part of said base region and a marginal area at least partially surrounding said base region;

selectively implanting base dopant into selected exposed portions of said main surface of said semiconductor substrate which become part of said base region by utilizing of an implantation mask;

forming an oxide frame surrounding said remaining portion of said first oxidation masking layer and an inner rim portion of said collector electrode by thermal oxidation;

removing the remaining portions of said first oxidation masking layer and all oxide layers disposed on said collector electrode;

disposing an emitter electrode of doped polycrystalline silicon on said exposed emitter region, said emitter electrode overlapping an inner rim portion of said oxide frame;

anisotropically etching selected portions of said oxide frame, said emitter electrode acting as an etch mask over that portion of said oxide frame overlapped by said emitter electrode, said anisotropic etching in the gas phase removing said oxide frame down to said semiconductor surface to expose a selected portion of said semiconductor surface, said step of anisotropic etching thus defining a rim portion of said emitter electrode and the strip of oxide at least partially surrounding said emitter electrode, an inner rim portion of said collector electrode simularly being at least partially surrounded by a strip of oxide;

implanting dopant ions of said base region into said exposed semiconductor surface;

disposing a metal layer of silicide forming metal on said integrated circuit, including particularly on said exposed surface of said semiconductor substrate, said metal layer having a thickness less than the thickness of said strip of oxide at least partially surrounding said emitter electrode and said oxide frame;

heating said metal layer to form a silicide layer on at least said emitter electrode, collector electrode portions of said semiconductor surface; and selectively removing said metal layer by etching away all metal not reacted to form silicide.

2. The improvement of claim 1 further comprising the steps of:

prior to disposing said first polycrystalline silicon layer on said semiconductor surface, defining a second opening in said field oxide layer, disposing a gate oxide layer in said second opening in which an insulated gate field effect transistor is to be fabricated;

disposing a masking layer portion of said first oxidation masking layer overlapping said field oxide layer in said second opening on an exposed surface of said semiconductor substrate and along at least a rim portion of said second opening;

wherein said steps of disposing said polycrystalline silicon layer and second oxidation masking layer, at least one gate electrode in said second opening as defined therein on a gate oxide layer;

disposing said second oxidation masking layer on said gate electrode in said second opening;

disposing said implantation mask in said second opening if said semiconductor substrate within said second opening contains dopants of a conductivity type the same as said base region of said bipolar planar transistor;

after said step of removing said implantation mask thermally oxidizing rim portions of said gate electrode;

removing all oxidation masking layers; and simultaneously with said step of disposing said doped polycrystalline layer for said emitter of said bipolar planar transistor, attaching electrodes on said exposed portions of said semiconductor substrate exposed after said step of removing said oxidation masking layer.

3. The method of claim 1 where in said step of selectively removing said polycrystalline silicon layer and said second oxidation masking layer, selective portions of said layers are removed to define a pattern in said first polycrystalline silicon layer which will be used as a pattern of conductors and which includes said conductor electrode.

4. The method of claim 2 where in said step of selectively removing said polycrystalline silicon layer and said second oxidation masking layer, selective portions of said layers are removed to define a pattern in said first polycrystalline silicon layer which will be used as a pattern of conductors and which includes said conductor electrode.

5. The method of claim 2 where in said step of selectively removing said polycrystalline silicon layer and said second oxidation masking layer, selected portions of said layers are removed to define a pattern which will be utilized as a conductor pattern which includes at least one gate electrode of an insulated gate field effect transistor.

6. The method of claim 3 where in said step of selectively removing said polycrystalline silicon layer and said second oxidation masking layer, selected portions of said layers are removed to define a pattern which will be utilized as a conductor pattern which includes at least one gate electrode of an insulated gate field effect transistor.

7. The method of claim 4 where in said step of selectively removing said polycrystalline silicon layer and said second oxidation masking layer, selected portions of said layers are removed to define a pattern which will be utilized as a conductor pattern which includes at least one gate electrode of an insulated gate field effect transistor.

8. An improvement in a method of manufacturing a very large scale integrated circuit at least one bipolar planar transistor and at least one insulated gate field effect transistor in a semiconductor substrate having a main semiconductor surface and covered with a field oxide comprising the steps of:

defining a first window for said bipolar planar transistor through said field oxide and a second window for said insulated gate field effect transistor through said field oxide by selectively removing portions of said field oxide, said bipolar transistor to have a collector, base and emitter region, said insulated gate field effect transistor to have a source, drain and insulated gate therebetween;

selectively disposing dopants into said semiconductors substrate through selected ones of said first and second windows;

selectively disposing a first masking layer within said first and second windows, said portion of said first masking layer disposed in said first window to ultimately define in said semiconductor substrate an emitter region of said bipolar planar transistor, said portion of said first making layer disposed on said semiconductor surface within said second window to define an area within said semiconductor surface to later become at least a source or drain contact area, said portion of said first masking layer disposed in said second window overlapping at least part of a common rim portion of said second window and said field oxide;

disposing a polycrystalline silicon layer on said first masking layer, field oxide and exposed portions of said semiconductor substrate;

disposing a second masking layer on said polycrystalline silicon layer;

selectively removing portions of said polycrystalline silicon layer and said second masking layer to exposed selected substrate areas in selected ones of said first and second windows to become at least portions of said base region, and source and drain regions;

selectively implanting dopants of the conductivity type of said base region into said exposed portions of said substrate at a first energy level insufficient to penetrate said first masking layer so that a peripheral region surrounding said portion of said first masking layer disposed in said first window is doped to become part of said base region of said bipolar planar transistor and so that a source and drain region separated by said insulated gate is formed within said semiconductor surface in said second window if said insulated gate field effect transistor is to have a conductivity type the same as said base region of bipolar planar transistor, otherwise masking said second window to prevent ion implantation therein prior to said step of implanting at said first energy level;

implanting dopants of said conductivity type of said base region at a higher second energy level sufficient to penetrate said first masking layer to form a contiguous base region in said semiconductor surface within said first window;

thermally oxidizing exposed silicon areas of said semiconductor substrate within said first and second windows to form an oxide frame around said first masking layer at least within said first window used to ultimately define said emitter region and on said source and drain regions in said second window, said oxide frame having an accentuated raised strip portion on its outer periphery at least within said first window;

removing said first masking layer;

selectively disposing doped polycrystalline silicon within said first and second windows on selected portions of said exposed surface, said portion with the doped polycrystalline silicon layer disposed within said first window being disposed in an overlapping relationship with said thermally grown oxide layer and covering said base region of said bipolar planar transistor, said portion within said first window to become an emitter electrode, said portion of said doped polycrystalline silicon layer in said second window being selectively disposed on at least one contact area within said insulated gate field effect transistor;

driving in dopants from said doped polycrystalline silicon layer into underlying unmasked portions of said semiconductor surface, said dopants being driven within said underlying portions within said first window to define said emitter region of said bipolar planar transistor;

anisotropically etching selected portions of said thermally grown oxide layer within said first and second windows, said oxide layer being etched in gas phase to expose underlying portions of said semiconductor surface, wherein said step of anisotropically etching leaves a rim frame portion of oxide surrounding at least part of said emitter electrode and an oxide peripheral strip portion at least partially surrounding said polycrystalline silicon layer which becomes a collector electrode, and thus leaves an oxide strip portion at least partially surrounding said portion of said polysilicon layer to be utilized as said insulated gate in said second window;

implanting dopants of a conductivity type the same as said dopants in the base region of said bipolar planar transistor into all exposed areas of said semiconductor substrate so that said base region defined in said step of said implantation at said second energy is extended within said first window to said oxide strip within said first window; and selectively reacting all exposed silicon to form a silicide layer, said silicide layer having a thickness less than the remaining portions of said thermal oxide remaining as said frame portion under said emitter electrode and said strip portion surrounding at least part of said collector electrode in said bipolar planar transistor within said first window.

* * * * *